(12) United States Patent
Kihira et al.

(10) Patent No.: US 6,394,817 B1
(45) Date of Patent: May 28, 2002

(54) CARD-TYPE DEVICE CONNECTOR

(75) Inventors: Satoru Kihira; Tsuyoshi Fukami; Shoichi Takada, all of Kanagawa (JP)

(73) Assignee: J.S.T. Mfg. Co., LTD, Osaka (JP)

( * ) Notice: Subject to any disclaimer, the term of this patent is extended or adjusted under 35 U.S.C. 154(b) by 0 days.

(21) Appl. No.: 09/985,831

(22) Filed: Nov. 6, 2001

(30) Foreign Application Priority Data

Dec. 27, 2000 (JP) ........................................ 2000-397214

(51) Int. Cl.⁷ .............................................. H01R 12/00
(52) U.S. Cl. ........................................ 439/76.1; 439/63
(58) Field of Search ........................... 439/66, 63, 76.1, 439/578, 607

(56) References Cited

U.S. PATENT DOCUMENTS

| | | | | |
|---|---|---|---|---|
| 4,603,320 A | * | 7/1986 | Farago | 341/100 |
| 4,603,926 A | * | 8/1986 | Nesbit et al. | 439/581 |
| 4,993,956 A | * | 2/1991 | Pickles et al. | 439/620 |
| 5,364,280 A | * | 11/1994 | Colleran | 439/76.1 |
| 5,454,734 A | * | 10/1995 | Eggert et al. | 439/578 |
| 6,296,514 B1 | * | 10/2001 | Medina et al. | 439/404 |

* cited by examiner

Primary Examiner—Tulsidas Patel
(74) Attorney, Agent, or Firm—Rader, Fishman & Grauer, PLLC

(57) ABSTRACT

A connector is disclosed which is to be used for connecting a card-type device to an assembled circuit board. This connector has: a connector body having a card mounting space formed therein; signal connection contact members disposed on the connector body; a metallic cover member rotatably attached to the connector body at one end thereof and arranged to regulate one end of the card-type device within the card mounting space when the cover member is in a closing state where the same closes at least a portion of the card mounting space; and a spring piece disposed at the cover member and arranged to be pressingly contacted with a surface of the card-type device.

11 Claims, 6 Drawing Sheets

CARD-TYPE DEVICE CONNECTOR

BACKGROUND OF THE INVENTION

1. Field of the Invention

The present invention relates to a card-type device connector to be used for mounting, on an assembled circuit board of any of a variety of apparatus, a card-type device such as a communication module, a memory module and a memory card. A typical example of the communication module includes a bluetooth transmission/reception module. Examples of the memory module include a SIMM (Single Inline Memory Module) and a DIMM (Dual Inline Memory Module). Examples of the memory card include an SD card and a multimedia card.

2. Description of Related Art

The bluetooth is a short-distance communication technology for which standardization has been started in May 1998 by five companies, i.e., Ericsson, IBM, Intel, Nokia and Toshiba. This is used for communicating, in radio, audio data or a synchronous data in a short distance of about 10 m.

To achieve such a short-distance communication technology, it is required to mount a bluetooth communication module (transmission/reception module) on apparatus which participates in communication, such as a cellular phone, a notebook computer, a digital household electrical appliance and equipment, or the like.

A bluetooth communication module has, for example, a connector portion used for connection with an assembled circuit board of such apparatus. When this connector portion is connected to a connector portion disposed on the assembled circuit board of the apparatus, the apparatus is electrically connected to the bluetooth communication module.

The bluetooth communication module has a high frequency circuit which handles a signal of a radio frequency band. It is therefore required to take a measure to meet the problem of heat generated in the high frequency circuit portion.

In a memory module (SIMM, DIMM or the like) having a memory IC mounted on a circuit board, too, heat generated at the time of its use causes trouble. Accordingly, a forced cooling means such as a cooling fan or the like is disposed in the box body of a personal computer, thus preventing the memory module from being excessively heated.

However, such a cooling mechanism can never be used in a very limited space inside of portable-type information apparatus such as a cellular phone, PDA (Personal Digital Assistant) or the like.

Further, an economical effective cooling structure has also been desired for a memory card such as a memory module, an SD card, a multimedia card, a smart media, a compact flash (CF) card, a memory stick or the like.

SUMMARY OF THE INVENTION

It is a first object of the present invention to provide a card-type device connector in which heat radiation in a card-type device can be achieved by a simple arrangement.

It is a second object of the present invention to provide a card-type device connector capable of achieving noise shielding in a card-type device.

The present invention relates to a connector (10) to be used for connecting a card-type device (100) to an assembled circuit board. This connector comprises: a connector body (1) having a (e.g., substantially rectangular) card mounting space formed therein; signal connection contact members (2) disposed on the connector body and having contacts (21) which are pressingly contacted with the signal connection portions of the card-type device, and connection portions (22) which are electrically connected to the assembled circuit board; a metallic cover member (5) rotatably attached to the connector body at one end thereof and arranged to regulate one end of the card-type device within the card mounting space when the cover member is in a closing state where the same closes at least a portion of the card mounting space; and a spring piece (58) disposed at the cover member and arranged to be pressingly contacted with the surface (particularly, in the vicinity of a memory IC or a high frequency circuit IC) of the card-type device. Numerals and alphabets in parentheses refer to corresponding component elements in the embodiments to be discussed later. However, it is a matter of course that the present invention should not be construed as limited to these embodiments. This is also applied to the following description.

According to the arrangement above-mentioned, when the card-type device is mounted on the card mounting space in the connector body and the cover member is rotated to close at least a portion of the card mounting space, the card-type device can electrically be connected to the assembled circuit board. When the cover member is closed, the spring piece (which is preferably integral with the cover member and made of metal) comes in contact with a surface of the card-type device to transmit heat generated in the card-type device to the cover member. Accordingly, heat is radiated from the surface of the metallic cover member to the surrounding space.

Thus, the connector is provided with a heat radiating function. Accordingly, a countermeasure for heat generated in the card-type device can be provided by a simple and economical arrangement. Further, since the connector for electrically connecting the card-type device to the assembled circuit board, is provided with a heat radiating function, a dedicated cooling means is not required to be disposed in the apparatus, thus preventing the apparatus from being increased in size.

To securely hold the card-type device in the card mounting space, a locking mechanism (locking pawl or the like) (54a, 56a) for keeping the closing state of the cover member (5), are preferably disposed at the cover member and/or the connector body.

A connector according to an embodiment of the present invention further comprises a heat transfer member (6) attached to the connector body, this heat transfer member being arranged to be pressingly contacted with the cover member and to be joined to the assembled circuit board to form a heat radiating passage thereto when the cover member is closed.

According to the arrangement above-mentioned, heat generated in the card-type device can be radiated from the cover member to the assembled circuit board through the heat transfer member, thus increasing the cooling efficiently. This effectively cools the card-type device.

Preferably, the connector of the present invention further comprises a noise-shielding connection member (6) disposed at the connector body and arranged to connect the cover member to a low-impedance portion of the assembled circuit board (the power supply portion or ground portion, for example) when the cover member is closed.

The cover member is made of metal. Accordingly, the cover member can be provided with not only a heat radiating function, but also a noise shielding function. Accordingly, to achieve an excellent noise shielding effect, the present invention is arranged such that the cover member is connected to a low-impedance portion of the assembled circuit board through the noise-shielding connection member. The noise-shielding connection member may also serve as the heat transfer member above-mentioned.

Preferably, an extension portion (54~57, 59, 60) is formed at the lateral side of the cover member for laterally covering portions of the card mounting space. This arrangement increases the noise shielding effect.

The card-type device may be a module having a circuit element mounted on a circuit board.

More specifically, the circuit element may form a high frequency circuit for communication, and the module may be a communication module. In such a case, the communication module may be a bluetooth transmission/reception module.

Further, the circuit element may comprise a memory IC and the module may be a memory module. In such a case, examples of the memory module include SIMM and DIMM.

Further, the card-type device may be a memory card having a memory chip hermetically sealed in a card-type shell. Examples of such a memory card include an SD card, a multimedia card, a smart media, a memory stick, a compact flash card, a PC card and the like.

These and other features, objects, advantages and effects of the present invention will be more fully apparent from the following detailed description set forth below when taken in conjunction with the accompanying drawings.

DESCRIPTION OF THE PREFERRED EMBODIMENTS

Figure 1:
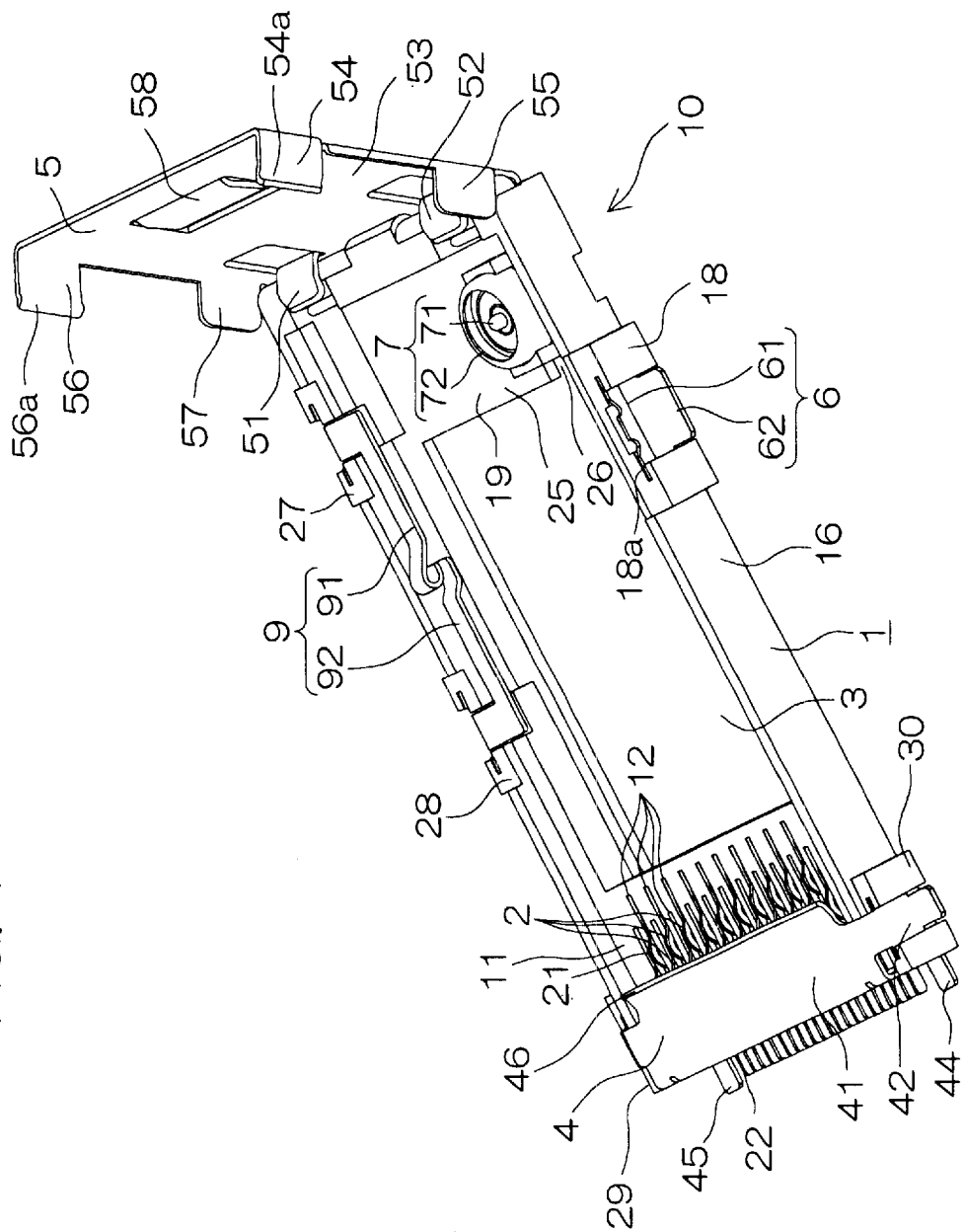
FIG. 1 is a perspective view of a communication module connector according to an embodiment of the present invention.
Figure 2:
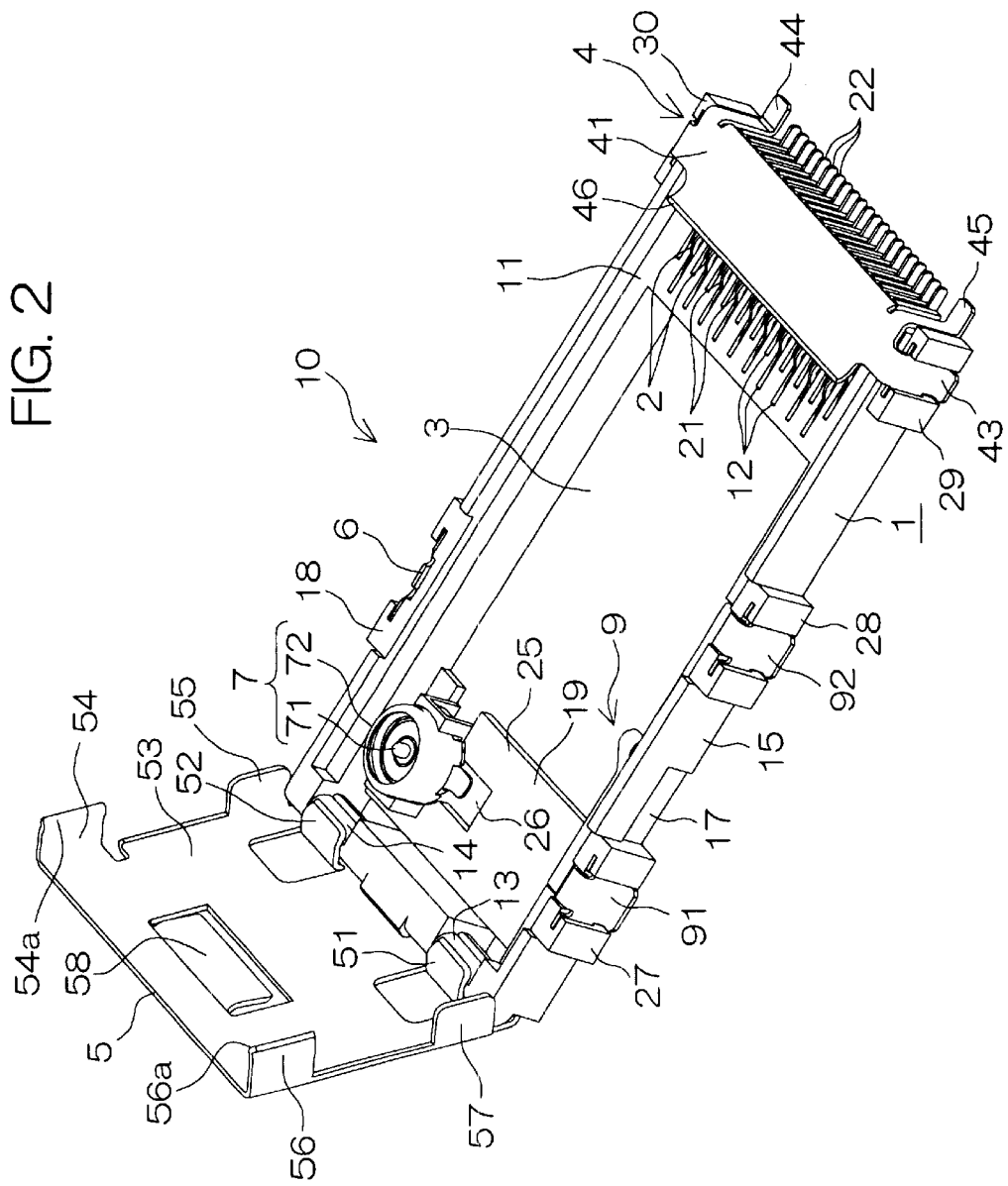
FIG. 2 is a perspective view of the communication module connector in FIG. 1, as rotated by an angle of about 180° around the perpendicular axis of FIG. 1.

FIG. 1 is a perspective view of a communication module connector 10 according to an embodiment of the present invention, and FIG. 2 is a perspective view of the communication module connector 10 in FIG. 1, as rotated by an angle of about 180° around the perpendicular axis of FIG. 1. This communication module connector 10 is used for mounting a communication module such as a bluetooth transmission/reception module or the like, on the assembled circuit board of apparatus such as a cellular phone, a notebook computer, a digital household electric appliance and equipment, or the like.

The connector 10 has a connector body 1 to be mounted on the assembled circuit board of the apparatus, and a cover member 5 openably connected to the connector body 1. The connector body 1 is composed of a molded article of a synthetic resin material, and is made in a substantially rectangular flame-like form in plan view. A plurality of contact members 2 made of a resilient metallic material are disposed in the vicinity of one shorter side of the connector body 1.

Each of the contact members 2 has a contact 21 projecting from a bottom surface 11 defining a module mounting space 3 inside of the connector body 1, and a connection portion 22 joined to the contact 21 and projecting along the longitudinal direction of the connector body 1 in the vicinity of the one shorter side of the connector body 1. The connection portions 22 are disposed so as to be positioned substantially in the same plane as the bottom surface (surface opposite to the assembled circuit board of the apparatus) of the connector body 1. The connection portions 22 are to be solder-joined to the assembled circuit board of the apparatus.

The contacts 21 are respectively fitted in slits 12 formed in the bottom surface 11 and project substantially in the form of a circular arc above the bottom surface 11. The slits 12 are parallel to one another and extend in the longitudinal direction of the connector body 1. The lengths, of adjacent slits 12, in the longitudinal direction of the connector body 1 are different from each other by a predetermined value. Accordingly, the contacts 21 of adjacent contact members 2 are different from each other in projecting position along the longitudinal direction of the connector body 1, such that the whole contacts 21 are disposed in so-called zigzags.

The connector body 1 is provided at the shorter side thereof at the side of the contact members 2 with a regulating member 4 for regulating one end of a communication module to be mounted on the module mounting space 3. More specifically, the regulating member 4 is attached as pressed into press-fit portions 29, 30 formed at both lateral sides 15, 16 of the connector body 1. Accordingly formed at one end of the module mounting space 3 is a shell having a substantially U-shape section for receiving the one end of the communication module.

According to this embodiment, the regulating member 4 is made of a metallic material, and has (i) a plate-like regulating portion 41 to be positioned on the one end of a communication module mounted on the module mounting space 3, (ii) hanging portions 42, 43 which hang down, from both ends of the regulating portion 41, along the lateral sides 16, 15, respectively, of the connector body 1, and (iii) another hanging portions 44, 45 which hang down, in the vicinity of both ends of the regulating portion 41, along the end surface of the connector body 1. The tip of each of the hanging portions 42~45 is bent in the form of an L shape so as to follow the assembled circuit board of the apparatus. That is, these tips are to be solder-joined to the assembled circuit board.

At the shorter side opposite to the contact members 2 of the connector body 1, there are formed a pair of cover-member mounting shafts 13, 14 to which the cover member 5 is rotatably joined. The cover-member mounting shafts 13, 14 are formed, with a space provided therebetween, along the shorter side of the connector body 1. Rotational mounting portions 51, 52 of the cover member 5 are rotatably engaged with the cover-member mounting shafts 13, 14, respectively.

The cover member 5 is formed by machining a metallic plate, and has (i) a main body 53 for covering a portion of the module mounting space 3 of the connector body 1, (ii) the above-mentioned rotational mounting portions 51, 52 formed by cutting, raising and shaping portions of the rotational end of the main body 53, and (iii) two pairs of hanging portions (reinforcing tabs) 54, 55; 56, 57 formed, with a space provided therebetween, at the lateral sides of the main body 53. The hanging portions 54–57 will hang down along the lateral sides of the connector body 1 when the cover member 5 is rotated, from the state shown in FIGS. 1 and 2, to a closing position where a portion of the module mounting space 3 is closed.

Locking portions 54a, 56a for keeping the closing state of the cover member 5, are disposed at the tips of the hanging portions 54, 56, out of the hanging portions 54–57, which are located in positions near the center portion of the module mounting space 3 when the cover member 5 is closed. When the cover member 5 is closed, these locking portions 54a, 56a project toward the module mounting space 3 and form cylindrical curved surfaces along the longitudinal direction of the connector body 1.

The connector body 1 is provided in one lateral side thereof with a locking recess portion 17 with which the locking portion 56a is engaged. Further, the connector body 1 is provided in the other lateral side 16 thereof with a heat-transfer-member press-fit portion 18 located at a position corresponding to the hanging portion 54. This heat-transfer-member press-fit portion 18 is opened toward the outside of the module mounting space 3. The heat-transfer-member press-fit portion 18 has a press-fit groove 18a, into which a heat transfer member made of a metallic material is pressed. This heat transfer member 6 has a step portion 61 concaved toward the module mounting space 3 so as to be engaged with the locking portion 54a, and a joint portion 62 of which lower portion is formed in an L shape and is to be solder-joined to the assembled circuit board. When the cover member 5 is rotated to come close to the connector body 1 and then brought to the closing position, the locking portion 56a is engaged with the locking recess portion 17 and the locking portion 54a is engaged with the step portion 61 of the heat transfer member 6, thus causing the cover member 5 to be locked at the closing state.

When the cover member 5 is in the closing position, the locking portion 54a resiliently comes in contact with the heat transfer member 6. Accordingly, heat from the cover member is radiated to the assembled circuit board through the heat transfer member 6. The joint portion 62 is solder-joined to a metallic portion of the assembled circuit board, e.g., a wide wiring pattern serving as ground potential.

The cover member 5 is provided in the vicinity of the end thereof opposite to the rotational mounting portions 51, 52 with a heat radiating tongue piece 58 formed by cutting and raising a portion of the main body 53. This heat radiating tongue piece 58 is resilient and has a substantially cylindrical curved face projecting toward the inside of the module mounting space 3 when the cover member 5 is closed. The heat radiating tongue piece 58 resiliently comes in contact with a communication module mounted on the module mounting space 3. Accordingly, heat generated in the communication module is transmitted to the heat radiating tongue piece 58 and then radiated to the air through the main body 53. Further, the heat generated in the communication module is transmitted to the assembled circuit board through the hanging portion 54 and the heat transfer member 6, thus causing the heat to be radiated.

Formed in the vicinity of the cover-member mounting shafts 13, 14 is a high-frequency-signal connector-element mounting portion 19 on which a coaxial connector 7 serving as a high-frequency-signal connector element can be mounted by press fit. The high-frequency-signal connector-element mounting portion 19 has a plate-like member 25 defining the module mounting space 3, and a notch serving as a coaxial-connector press-fit portion 26 is formed in the plate-like member 25 as passing therethrough.

The coaxial connector 7 has a signal contact 71 at the center and a cylindrical ground contact 72 disposed as surrounding the signal contact 71. The signal contact 71 and the ground contact 72 are resiliently biased upwardly in FIGS. 1 and 2.

A switch member 9 for detecting the presence/absence of a communication module is disposed in the module mounting space 3 at a position near the one lateral side 15 of the connector body 1. The switch member 9 has a pair of contacts 91, 92 each made of a resilient metallic piece. The base ends of the contacts 91, 92 are respectively pressed into contact press-fit portions 27, 28 formed as projecting from the lateral side 15 of connector body 1. The base ends of the contacts 91, 92 hang down along the lateral side 15 of the connector body 1 and reach the vicinity of the bottom of the connector body 1. These base ends will be solder-joined to the wiring pattern on the assembled circuit board.

This embodiment is arranged such that, when a communication module is mounted on the module mounting space 3, one contact 91 is resiliently deformed to come in contact with the other contact 92, causing the switch member 9 to be conducted. When no communication module is mounted on the module mounting space 3, the contacts 91, 92 are kept as opened. Accordingly, the presence/absence of a communication module can be detected by detecting the conduction/non-conduction of the switch member 9 at the side of the apparatus.

Figure 3:
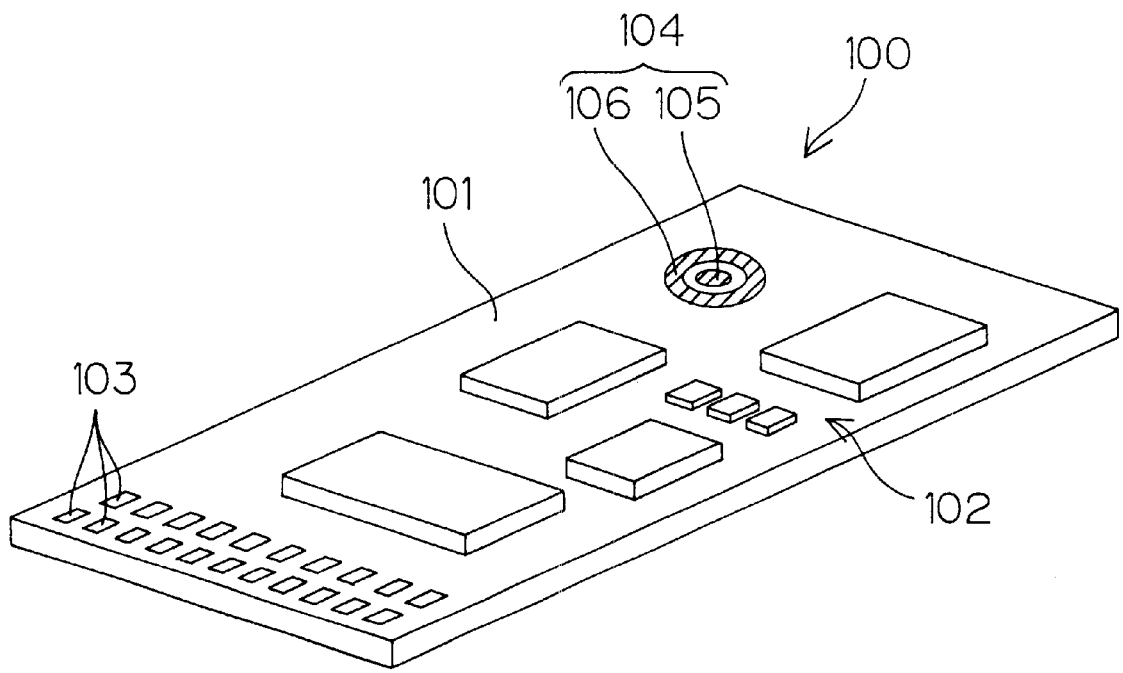
FIG. 3 is a simplified perspective view of an example of a communication module to be mounted on the connector in FIG. 1.

FIG. 3 is a simplified perspective view of an example of a communication module 100 to be mounted on the connector 10 having the arrangement above-mentioned. This communication module 100 is a bluetooth transmission/reception module comprising a circuit board 101 and a plurality of circuit elements which are mounted on the circuit board 101 and form a high frequency circuit 102. The circuit board 101 is made substantially in the form of a rectangular card. Formed along a shorter side at one end side of the circuit board 101 are ordinary signal metallic pads 103 for communicating a signal of an ordinary frequency band with the assembled circuit board of the apparatus. The metallic pads 103 are for example formed by exposing, to the outside, portions of the metallic wiring pattern on the circuit board 101. The metallic pads 103 are formed in a plural number in zigzags corresponding to the zigzag arrangement of the contacts 21 of the contact members 2 of the connector 10. Formed at the other end (opposite to the metallic pads 103) of the circuit board 101 is a high-frequency-signal terminal portion 104 so as to match the disposition of the coaxial connector 7 mounted on the connector body 1. The high-frequency-signal terminal portion 104 has a high-frequency-signal metallic pad 105 and an annular ground metallic pad 106 surrounding the same. The metallic pads 105, 106 may be formed by exposing, to the outside, portions of the wiring conductors formed on the circuit board 101.

Figure 4:
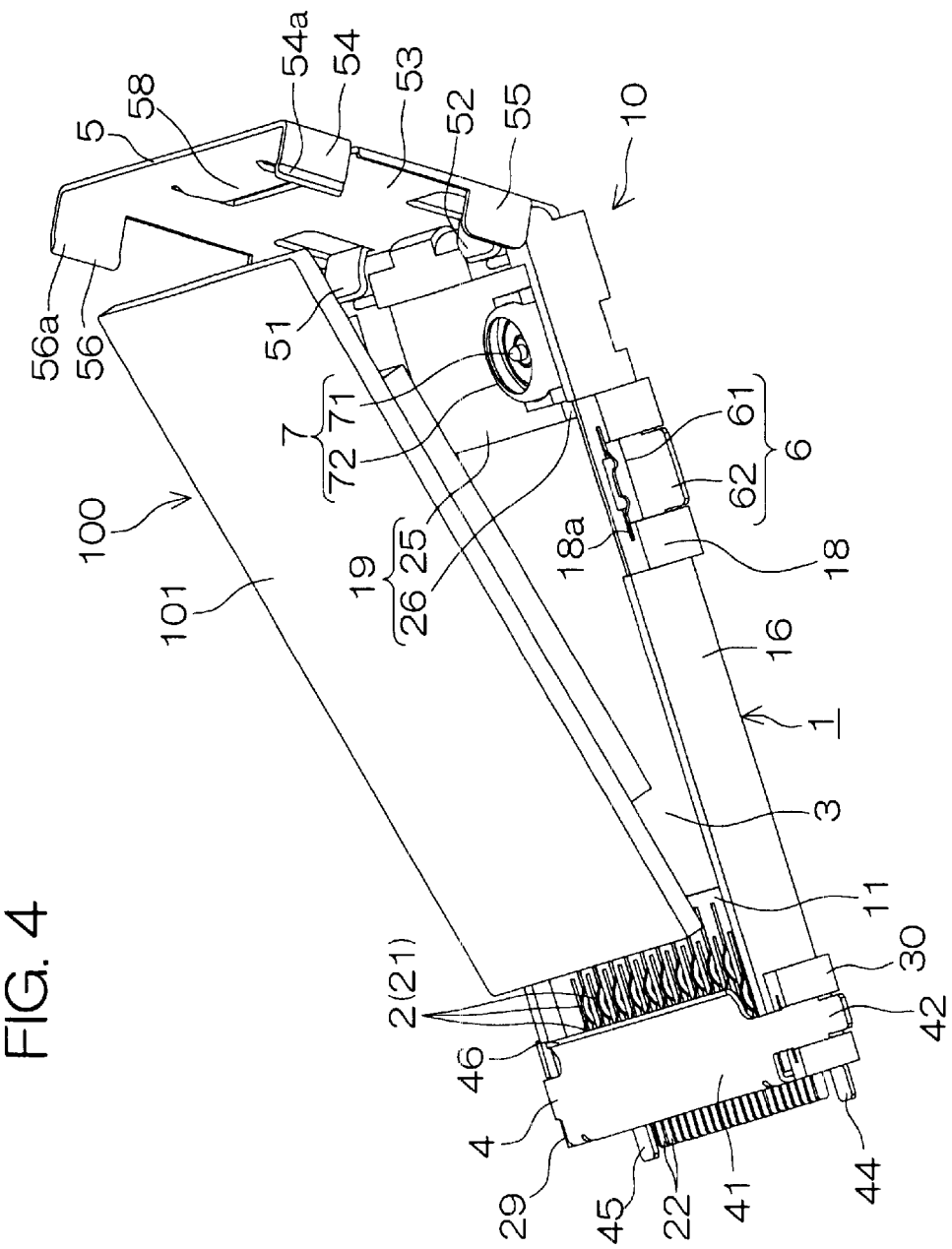
FIG. 4 is a perspective view illustrating the state in which a communication module is on the way in its installation on the connector in FIG. 1.
Figure 5:
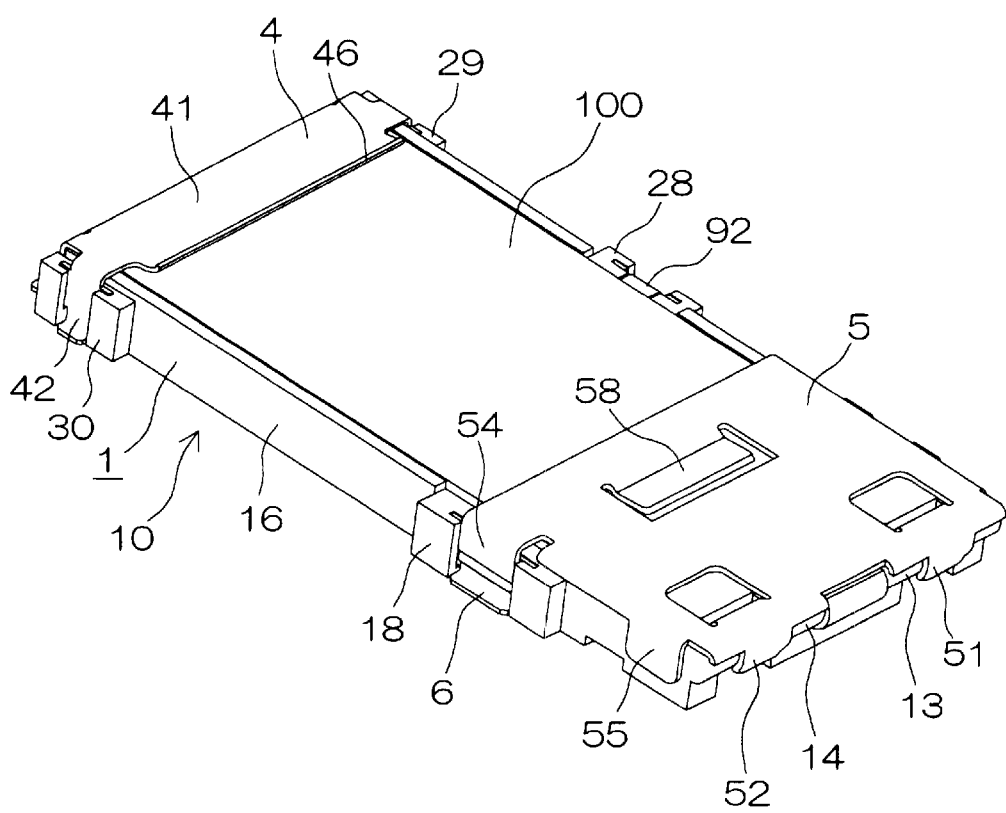
FIG. 5 is a perspective view illustrating the state in which the installation of the communication module on the connector in FIG. 1 is completed.

FIG. 4 is a perspective view illustrating the state in which the communication module 100 is on the way in its installation on the connector 10, and FIG. 5 is a perspective view illustrating the state in which the installation of the communication module 100 on the connector 10 is completed. The communication module 100 is mounted, with the bottom up, on the module mounting space 3 with the metallic pads 103 and the metallic pads 105, 106 (FIG. 3) turned to the contact members 2 and the coaxial connector 7, respectively. More specifically, the communication module 100 is positioned such that the end at the side of the metallic pads 103 corresponds to the side of the contact members 2 and that the metallic pads 105, 106 correspond to the side of the coaxial connector 7. Then, the end at the side of the metallic pads 103 is inserted into the space between the regulating member 4 and the bottom surface 11. An upwardly curved guide portion 46 is formed at the edge of the regulating member 4 at the side of the module mounting space 3. This guide portion 46 is arranged to smoothly guide one end of the communication module 100 inserted obliquely from above, to the space under the regulating member 4.

When one end of the communication module 100 is inserted into the space between the regulating member 4 and the bottom surface 11, the other end of the communication module 100 is pushed into the module mounting space 3. At this time, the other end of the communication module 100 comes in contact with the tips of the rotational mounting portions 51, 52 of the cover member 5. When the communication module 100 is further pushed into the module mounting space 3, the communication module 100 gives moment in the cover closing direction to the cover member 5 through the rotational mounting portions 51, 52. This means that the installation operation of the communication module 100 causes the cover member 5 to start rotating in the closing direction. After the communication module 100 has been pushed into the module mounting space 3, the user further rotates the cover member 5 in the closing direction such that the locking portions 54a, 56a are respectively engaged with the step portion 61 of the heat transfer member 6 and the locking concave portion 17 against the resilient biasing force of the coaxial connector 7. This provides a closing state shown in FIG. 5.

In this state, the metallic pads 103 of the communication module 100 come in resilient contact with the contacts 21 of the contact members 2. This contact state is kept by the fact that the one end of the communication module 100 is regulated by the regulating member 4. On the other hand, at the other end of the communication module 100, the metallic pads 105, 106 respectively come in resilient contact with the signal contact 71 and the ground contact 72 of the coaxial connector 7. This contact state is kept by the fact that the cover member 5 is locked in the closing state.

The heat transfer member 6 arranged to be contacted with the cover member 5 through the locking portion 54a as discussed in the foregoing, is joined to the ground potential portion of the assembled circuit board. Accordingly, the cover member 5 made of a metallic material is provided with a noise shielding function. More specifically, the cover member 5 can shield electromagnetic noise which is externally exerted to the high frequency circuit 102 on the communication module 100 positioned inside of the cover member 5. The cover member 5 is provided in the vicinity of the rotational mounting portions 51, 52 with the hanging portions 55, 57. These hanging portions 55, 57 cover the module mounting space 3 laterally, thus contributing to an increase in noise shielding function.

Figure 6:
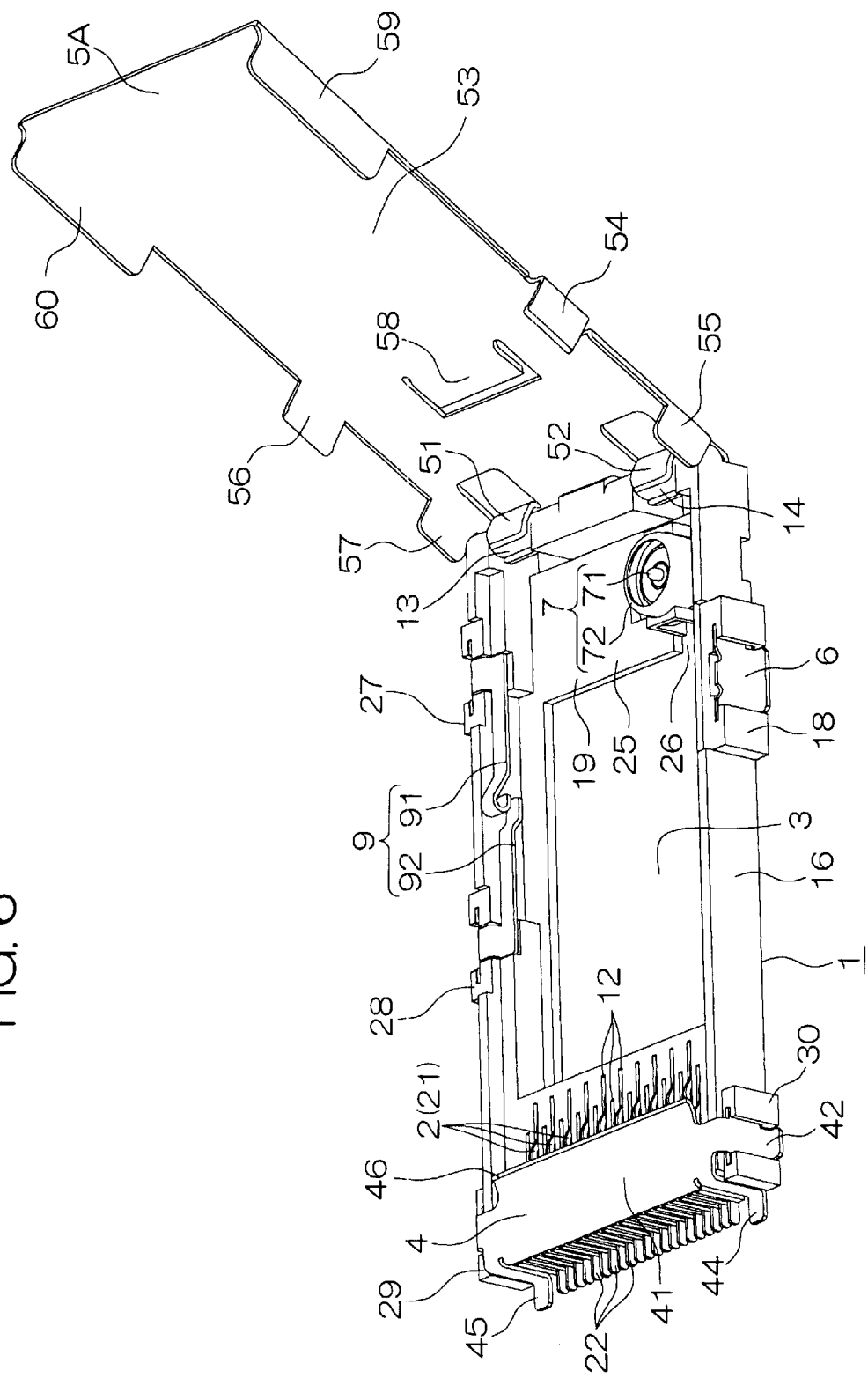
FIG. 6 is a perspective view of a connector according to another embodiment of the present invention.

In the foregoing, an embodiment of the present invention has been discussed. However, the present invention can also be embodied in a different manner. For example, the embodiment above-mentioned is arranged such that the cover member 5 does not cover the whole module mounting space 3, but covers only a portion, near the coaxial connector 7, of the module mounting space 3. However, as shown in FIG. 6, there may be used a cover member 5A having sizes which cover the whole module mounting space 3. When such large cover member 5A is used, there can be expected not only a greater heat radiating effect, but also an external noise shielding effect. The large cover member 5A in FIG. 6 has hanging portions (reinforcing tabs) 59, 60 which hang down from the main body 53, at both sides of the tip to be located in the vicinity of the contact members 2 when the cover member 5A is closed. This further improves the noise shielding effect.

For the arrangement in FIG. 6, it is required to assure a large space for opening and closing the large cover member 5A. Accordingly, when the cover-member opening/closing space is limited, the small cover member 5 shown in the embodiment above-mentioned is preferably used.

In FIG. 6, like parts are designated by like reference numerals used in FIG. 1 to FIG. 5.

In the embodiment above-mentioned, the description has been made of the connector used with a coaxial connector mounted thereon. However, when the communication module incorporates an antenna, no coaxial connector is required to be mounted on the connector. Specifically, the connector 10 in the embodiment above-mentioned may be used for both a communication module using an external antenna and a communication module incorporating an antenna.

Further, the embodiment above-mentioned has been discussed with a communication module taken as an example of the card-type device. However, the connector of the present invention can widely be applied to a module having the arrangement in which circuit elements are mounted on a circuit board. Examples of such a module include a memory module such as SIMM, DIMM or the like. Further, the connector of the present invention can also be applied to a memory card having the arrangement in which memory chips are hermetically sealed in a card-type shell.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application corresponds to Japanese Patent cation Serial No. 2000-397214 filed on Dec. 27, 2000 with Japanese Patent Office, the disclosure of which incorporated herein by reference.

What we claim is:

1. A card-type device connector to be used for connecting a card-type device to an assembled circuit board, comprising:

a connector body having a card mounting space formed therein;

signal connection contact members disposed on said connector body and having contacts which are pressingly contacted with the signal connection portions of said card-type device, and connection portions which are to be electrically connected to said assembled circuit board;

a metallic cover member rotatably attached to said connector body at one end thereof and arranged to regulate one end of said card-type device within said card mounting space when said cover member is in a closing state where the same closes at least a portion of said card mounting space; and a spring piece disposed at said cover member and arranged to be pressingly contacted with a surface of said card-type device.

2. A card-type device connector according to claim 1, further comprising a locking mechanism for keeping the closing state of said cover member.

3. A card-type device connector according to claim 1, wherein said spring piece is integral with said cover member and made of metal.

4. A card-type device connector according to claim 1, further comprising a heat transfer member attached to said connector body, said heat transfer member being arranged to be pressingly contacted with said cover member and to be joined to said assembled circuit board to form a heat radiating passage thereto when said cover member is closed.

5. A card-type device connector according to claim 1, further comprising a noise-shielding connection member disposed at said connector body and arranged to connect said cover member to a low-impedance portion of said assembled circuit board when said cover member is closed.

6. A card-type device connector according to claim 1, further comprising a heat transfer member attached to said connector body, said heat transfer member being arranged to be pressingly contacted with said cover member and to be joined to a low-impedance portion of said assembled circuit board to form a heat radiating passage thereto when said cover member is closed, said heat transfer member also serving as a noise-shielding connection member.

7. A card-type device connector according to claim 1, wherein an extension portion is formed at a lateral side of said cover member for laterally covering a portion of said card mounting space.

8. A card-type device connector according to claim 1, wherein said card-type device is a module having a circuit element mounted on a circuit board.

9. A card-type device connector according to claim 8, wherein said circuit element forms a high frequency circuit for communication, and said module is a communication module.

10. A card-type device connector according to claim 8, wherein said circuit element comprises a memory IC and said module is a memory module.

11. A card-type device connector according to claim 1, wherein said card-type device is a memory card having a memory chip hermetically sealed in a card-type shell.

* * * * *